United States Patent
Harush

(10) Patent No.: US 11,764,802 B1
(45) Date of Patent: Sep. 19, 2023

(54) SIGMA-DELTA MODULATOR FOR HIGH-RESOLUTION CONTROL OF RING OSCILLATOR IN DIGITAL PHASE-LOCKED LOOP

(71) Applicant: Cypress Semiconductor Corporation, San Jose, CA (US)

(72) Inventor: Avri Harush, Herzeliya (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/704,511

(22) Filed: Mar. 25, 2022

(51) Int. Cl.
- *H03L 7/099* (2006.01)
- *H03M 3/00* (2006.01)
- *G04F 10/00* (2006.01)
- *H03M 1/50* (2006.01)

(52) U.S. Cl.
CPC .......... *H03M 3/424* (2013.01); *G04F 10/005* (2013.01); *H03L 7/0991* (2013.01); *H03L 7/0995* (2013.01); *H03M 1/502* (2013.01); *H03L 2207/50* (2013.01)

(58) Field of Classification Search
CPC .. H03K 3/0315; H03K 3/0322; H03L 7/0991; H03L 2207/50; H03L 7/0995
See application file for complete search history.

(56) References Cited

U.S. PATENT DOCUMENTS

| | | | | |
|---|---|---|---|---|
| 6,988,227 | B1* | 1/2006 | Perrott | H04L 1/205 714/704 |
| 7,352,297 | B1* | 4/2008 | Rylyakov | H03M 7/165 331/25 |
| 10,749,664 | B1* | 8/2020 | Wang | H03L 7/0995 |
| 11,036,253 | B1* | 6/2021 | Paternoster | H03L 7/0995 |
| 2010/0188158 | A1* | 7/2010 | Ainspan | H03L 7/099 331/1 A |
| 2011/0267120 | A1* | 11/2011 | Ravi | H03L 7/1978 327/159 |
| 2011/0273210 | A1* | 11/2011 | Nagaraj | H03L 7/104 327/159 |
| 2019/0028108 | A1* | 1/2019 | Gao | H03L 7/0891 |
| 2019/0268008 | A1* | 8/2019 | Khoury | H03L 7/0991 |

* cited by examiner

*Primary Examiner* — Levi Gannon

(57) ABSTRACT

A digitally-controlled oscillator (DCO) circuit includes a digital-to-analog converter (DAC) to generate a first current based on most significant bits of a multi-bit code received from a time-to-digital converter (TDC) of a digital phase-locked loop (PLL). The DCO circuit further includes a sigma-delta modulator (SDM) to modulate least significant bits of the multi-bit code into a set of digital bits based on a first frequency of a feedback clock of the DPLL. The set of digital bits is to cause the DAC to generate a second current. The DCO circuit further includes a ring oscillator coupled to the DAC, the ring oscillator to generate an alternating-current (AC) output signal having a second frequency corresponding to a combination of the first current and the second current.

19 Claims, 4 Drawing Sheets

100 US 11,764,802 B1

SIGMA-DELTA MODULATOR FOR HIGH-RESOLUTION CONTROL OF RING OSCILLATOR IN DIGITAL PHASE-LOCKED LOOP

TECHNICAL FIELD

This disclosure relates to digital phase-locked loops, and more specifically, to a sigma-delta modulator for high-resolution control of a ring oscillator in a digital phase-locked loop.

BACKGROUND

A phase-locked loop (PLL) is a control system that generates an output signal whose phase is related to the phase of an input signal. There are several different types, but the simplest is an electronic circuit that includes a variable frequency oscillator and a phase detector in a feedback loop. The oscillator generates a periodic signal, and the phase detector compares the phase of that signal with the phase of the input periodic signal, adjusting the oscillator to keep the phases matched. Thus, the PLL operates on two inputs that can be understood as a reference clock and a feedback clock. Part of the function of the PLL is to approximate the delay between these two inputs in order to make matching adjustments.

In certain digital PLLs (DPLLs), a digitally-controlled oscillator (DCO) is described as a code-to-frequency circuit, where for each input code, there is a unique output frequency. The resolution of the output frequency is thus a function of the number of bits used for the DCO code. Thus, for a high-resolution DPLL, a large number of bits may be required in the DCO code. To employ a large number of bits may require a large area and a large power consumption of the DPLL components. Additionally, process, voltage, temperature (PVT) silicon corners have a strong impact on the DPLL resolution, degrading the effective and/or worst case actual resolution.

DETAILED DESCRIPTION

The following description sets forth numerous specific details such as examples of specific systems, components, methods, and so forth, in order to provide a good understanding of various embodiments of a digital phase-locked loop (DPLL) described herein. Such DPLLs may be employed in memory control units in different types of transportation vehicles. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Figure 1:
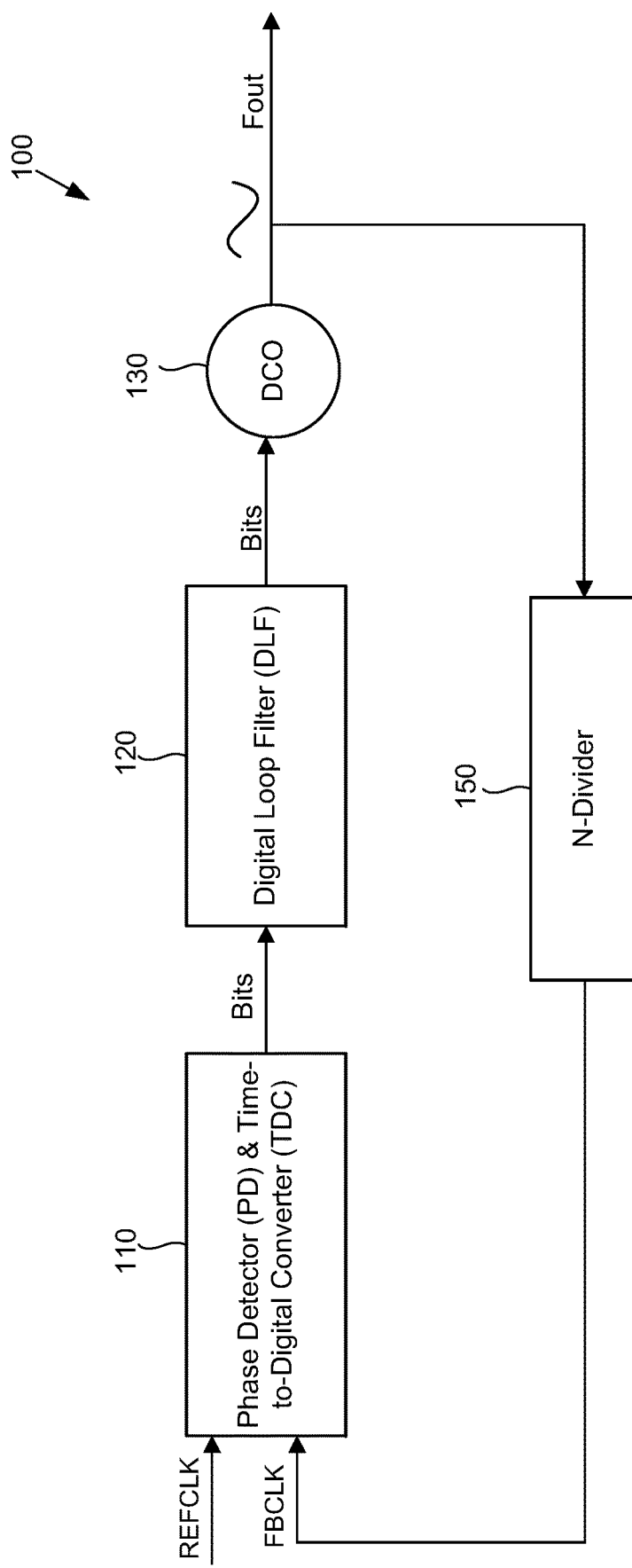
FIG. 1 is a simplified block diagram of a digital phase-locked loop (DPLL) employed in certain electronic devices.

FIG. 1 is a simplified block diagram of a digital phase-locked loop (DPLL) 100 employed in certain electronic devices. In some cases, the DPLL 100 includes a phase detector (PD) and time-to-digital converter (TDC) 110, a digital loop filter (DLF) 120, a digitally-controlled oscillator (DCO) 130, and a frequency divider 150, generally coupled together in a loop, as illustrated. In such DPLL 100, the PD (of the PD & TDC 110) is adapted to detect a phase and frequency of an input reference clock (REFCLCK) and a feedback clock (FBCLK). Further, in the DPLL 100, the TDC of the PD & TDC 110 is configured to determine a time difference (e.g., a phase error) between the reference frequency (Fref) of the input reference clock and the feedback frequency (Fb) of the feedback clock.

As discussed previously, the TDC of the PD & TDC 110 generates a multi-bit code that digitally encodes the time difference (e.g., quantifies the phase error) and is designed to trigger the DCO 130 to adjust an output frequency (Fout) of an alternating-current (AC) output signal of the DPLL 100. The DCO 130 of DPLLs is generally implemented as a code-to-frequency circuit, where for each input code (e.g., set of digital bits), there is a unique output frequency if the DCO 130. The DLF 120, which is coupled between the TDC and the DCO 130, digitally filters the multi-bit code to ensure accurate delivery of the individual bits of the multi-bit code to the DCO 130.

In various applications, the DPLL 100 may be employed in battery-powered consumer electronics, lower-power wireless sensors, home automation systems, remote controls, and automotive memory control units (MCUs), for example, where low cost, low power, less board of materials (BOM), and smaller size are highly desired. The DLF 120 is generally implemented as an on-chip integrated loop filter to further keep the design smaller than analog counterparts. The frequency divider 150 divides the output frequency of the AC output signal by an integer value (N) in order to generate the feedback clock that flows back into the PD & TDC 110. The DPLL 100 is thus designed to operate in a feedback loop in which the time difference between the input reference clock and the feedback clock is minimized until "locking" onto the frequency and phase of the input reference clock.

While DPLLs generally operate with better phase noise, lower spurious performance, and faster lock time than their analog counterparts due to being digitally-modulated, a DPLL (such as the DPLL 100) that seeks much higher resolution for higher frequency operation requires a large number of bits in the multi-bit code in order to modulate the DCO 130 so that the DPLL achieves the high resolution without jitter. As previously discussed, to employ a large number of bits generally requires a large area and a large power consumption of the DPLL components, making the DPLL 100 still a partially-deficient solution for some applications.

As just one example for purposes of explanation, assume the DCO 130 has a 4 megahertz (MHz) finite resolution at frequencies of 798 MHz and 802 MHz. For a target frequency of 800 MHz, the lowest-significant bits of the multi-bit code output by the TDC toggles between the 802 MHz code and the 798 MHz code with a duty cycle of 50%, never reaching a stead state at 800 MHz. Because there is no code that will directly modulate the DCO 130 at 800 MHz, the TDC toggles between the nearby frequencies, causing unwanted jitter at a lower-than-desired resolution.

Figure 2:
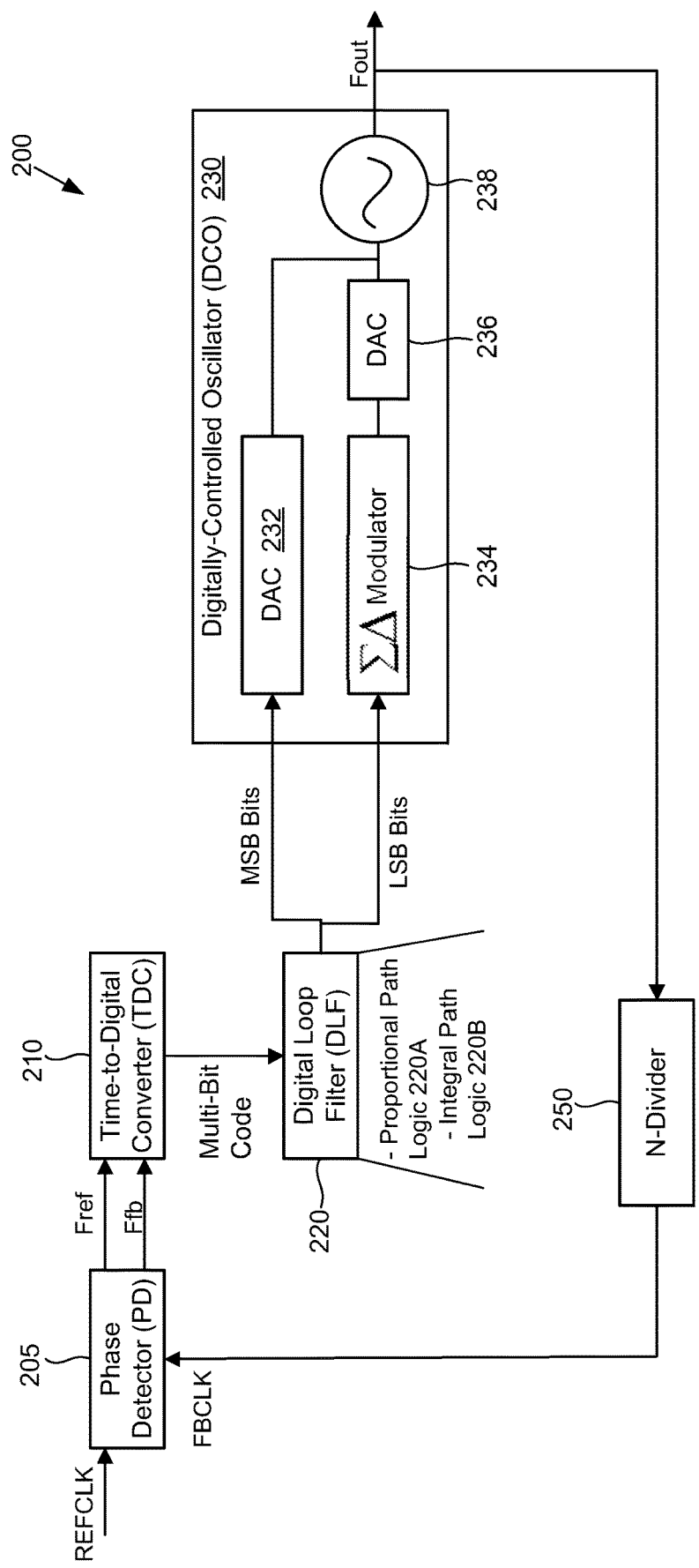
FIG. 2 is a more-detailed block diagram of a DPLL in accordance with at least some embodiments.

FIG. 2 is a more-detailed block diagram of a digital PLL (or DPLL 200) in accordance with at least some embodiments, which is designed to resolve the deficiencies of certain DPLLs that were discussed with reference to FIG. 1. The DPLL 200, in various embodiments, may be a DPLL circuit, a DPLL device, or a DPLL apparatus. The DPLL 200, for example, may include a phase detector (PD) 205, a time-to-digital converter (TDC) 210 coupled to the PD 205, a digital loop filter (DLF) 220 coupled to the TDC 210, a digitally-controlled oscillator (DCO) circuit 230 coupled to the DLF 220, and a frequency divider 250 coupled between an output of the DCO circuit 230 and the PD 205, all of which are digital components, except that the DCO circuit 230 will also include some analog components as will be described.

In these embodiments, the PD 205 is configured to detect a phase and frequency of an input reference clock (REFCLCK) and a feedback clock (FBCLK), e.g., so as to be able to provide the reference frequency (Fref) and phase of the input reference clock and the feedback frequency (Ffb) and phase of the feedback clock to the TDC 210. Further, the TDC 210 is configured to determine a time difference (e.g., a phase error) between the reference frequency (Fref) of the input reference clock and the feedback frequency (Fb) of the feedback clock. According to these embodiments, the TDC 210 then generates a multi-bit code that digitally encodes the time difference (e.g., phase error) and is designed to trigger the DCO circuit 230 to adjust an output frequency (Fout) of an alternating-current (AC) output signal of the DPLL 200. In at least one embodiment, the DCO circuit 230 is configured to generate an output signal that is convertible to the feedback clock, e.g., via the frequency divider 250, as will be discussed.

In at least some embodiments, the DLF 220 is configured to digitally filter the multi-bit code from the TDC to generate a filtered multi-bit code, e.g., that has accurate bits capable of accurately driving the DCO circuit 230. The DLF 220, for example, may include proportional path logic 220A having a first gain and integral path logic 220B having a second gain. In some embodiments, the DLF 220 implements a z-domain transfer function to process a combination of a proportional part of the multi-bit code multiplied by the first gain and an integral part of the multi-bit code multiplied by the second gain. The proportional path logic 220A and the integral path logic 220B may both be instantiated in an on-chip integrated loop filter. The DLF 220 may also be configured to separate the most significant bits (MSB) from the least significant bits (LSB) of the filtered multi-bit code so that the most significant bits can be delivered separately within the DCO circuit 230 from the least significant bits, as will be explained.

In these embodiments, and to overcome the deficiencies of previous designs, the DCO circuit 230 is configured to employ not only a digital-to-analog converter (DAC) 232, but also a sigma-delta modulator (SDM) 234, both which feed current to a ring oscillator 238. For example, in at least some embodiments, the DAC 232 generates a first current based on the most significant bits of a multi-bit code received from the TDC 210. Further, in at least these embodiments, the SDM 234 modulates the least significant bits of the multi-bit code into a set of digital bits based on a first frequency of a feedback clock (FBCLK). The set of digital bits (also referred to as trims), for example, causes a DAC 236 to generate a second current. In some embodiments, the DAC 232 is employed to generate both the first current and the second current, and thus, the DAC 236 may be integrated within the DAC 232.

In these embodiments, the DCO circuit 230 further includes the ring oscillator 238 coupled to the DAC 232 and optionally also the DAC 236, if the latter is included. In at least some embodiments, the ring oscillator 238 receives both the first current and the second current, and is configured to generate an alternating-current (AC) output signal (Fout) having a second frequency corresponding to a combination of the first current and the second current.

In these embodiments, the frequency divider 250 divides the output (e.g., second) frequency of the AC output signal by an integer value (N) in order to generate the feedback clock (FBCLK) having the first frequency that flows back into the PD 205. Thus, the feedback frequency is generally forced lower in order for the TDC 210 to conduct a proper time-based comparison between the reference frequency and the feedback frequency, which generates the next multi-bit code as the DPLL 200 continues loop operation.

In at least some embodiments, the SDM 234 operates at a higher frequency than that of the TDC 210, providing the modulated set of digital bits that enable the connected DAC to average the frequency deltas within the DCO circuit 230, which would otherwise be generated as a result of the TDC 210 toggling between digital codes. By averaging the frequency deltas, the SDM 234 enables fine-tuning the amount of current sent to the ring oscillator 238 in a way that reaches a steady state of somewhere in the middle of the frequency range (e.g., 800 MHz in the above example) represented by the toggling codes from the TDC 210. In this way, the final output frequency resolution depends on a combination of the resolution of the TDC 210 toggling between codes and the resolution of the SDM 234 modulating the set of digital bits, which can be a very high resolution with a comparatively low area and power requirements.

Figure 3:
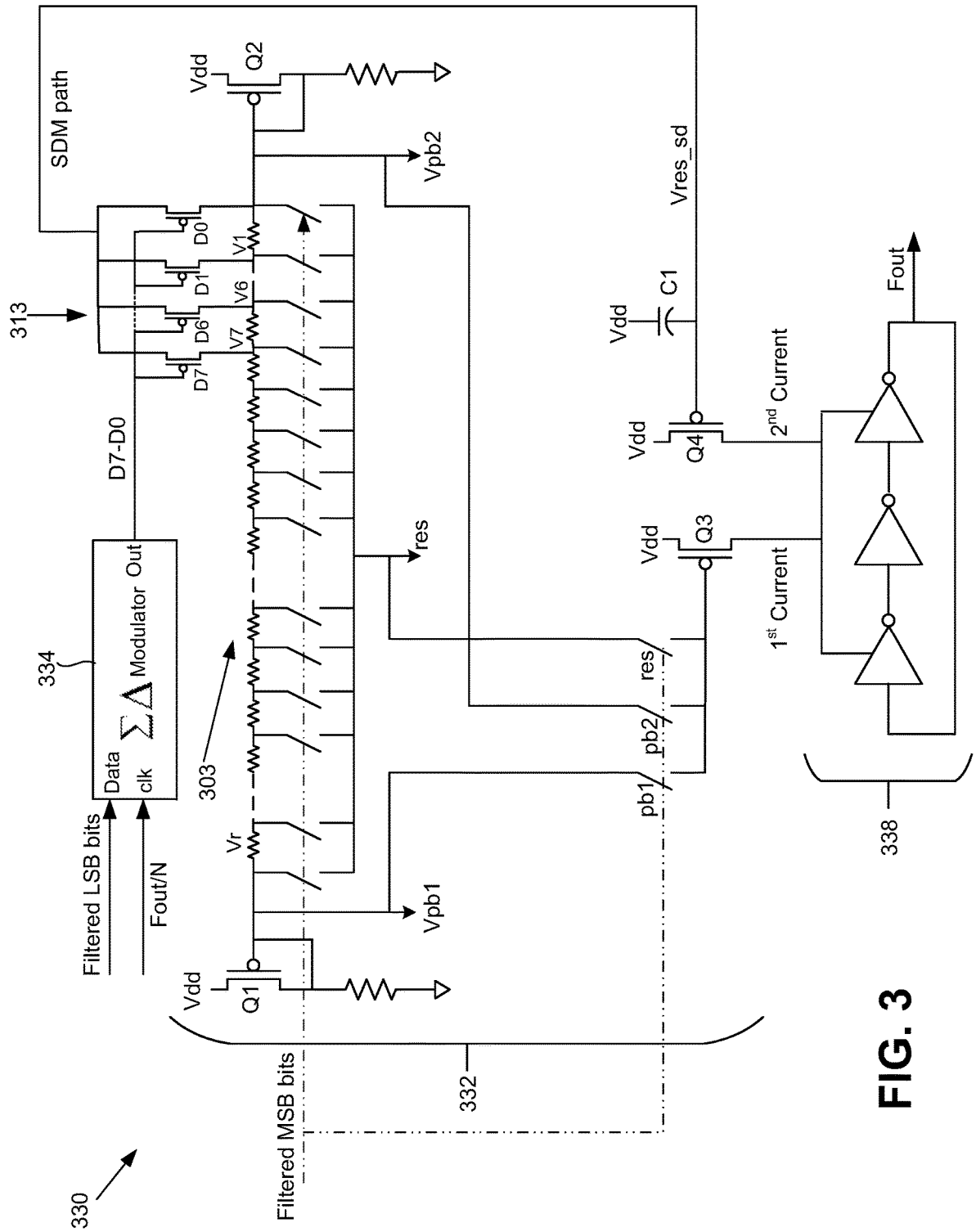
FIG. 3 is a is a schematic circuit diagram, including a sigma-delta modulator, of a digitally-controlled oscillator (DCO) circuit of various DPLLs in accordance with at least some embodiments.

FIG. 3 is a is a schematic circuit diagram, including a sigma-delta modulator (SDM) 334, of a digitally-controlled oscillator (DCO) circuit 330 of various DPLLs in accordance with at least some embodiments. In some embodiments, the DCO circuit 330 is the DCO circuit 230 illustrated in FIG. 2. In at least some embodiments, modulation of the SDM 334 occurs at a higher frequency than that of operating the DAC 232 (or DAC 236) and may be implemented, in part, with a register-transfer level (RTL) digital logic and hardware that provides a compact design. In these embodiments, the SDM 334 operates on the filtered LSB code received from the TDC 210 and DLF 220 based on the first frequency of the feedback clock, which is the second frequency output by a ring oscillator 238 or 338 divided by N of the frequency divider 250 (e.g., Fout/N). The SDM 334 modulates the filtered LSB code at this higher frequency to generate a set of digital bits (D7-D0). While the set of digital bits (D7-D0) is illustrated as being eight in number, fewer or more digital bits are envisioned and also possible in other embodiments.

In at least some embodiments, the DCO circuit 330 includes at least one DAC 332 to convert the multi-bit code from the TDC 210 (received as the filtered MSB bits) into the first current and the set of digital bits from the SDM 334 into the second current, both of which are provided to the ring oscillator 338, as will be explained in more detail. The DAC 332 may include a string of resistors 303 that are selectable according to the most significant bits (MSB) of the filtered multi-bit code received from the DLF 220. The string of resistors 303 may be tapped at a certain location in response to the filtered MSB bits triggering at least one switch arrayed along the string of resistors 303. Thus, the string of resistors 303 may be coupled between a pair of drain-gate-connected, transistors (Q1 and Q2), causing a voltage (Vr) across each of the selected resistors to be equal to Vpb2−Vpb1 divided by the total number of resistors (e.g., 64, 32, 16, or the like). In this way, the string of resistors 303 operates as a large voltage divider to a provide a measure of resolution in providing the first current to a ring oscillator 338 through a third transistor (Q3).

Thus, in at least some embodiments, the string of resistors 303 are selectively coupled to a gate of the third transistor (Q3) that is coupled between a supply voltage (Vdd) and the ring oscillator 338. And, to generate the first current, the filtered MSB bits cause a tapped selection of a subset of resistors of the string of resistors 303. The multi-bit code (e.g., filtered MSB bits) may also trigger the switches labeled as pb1, pb2, and res to close, in order to provide the first current to the ring oscillator 338. In some embodiments, circuitry of the DAC 332 is replicated to provide additional resolution in the first current provided to the ring oscillator 338. While the ring oscillator 338 is illustrated as having three inverters, another number of inverters may be employed (e.g., 5, 7 or the like) in other embodiments. Further, while the transistors of the DAC 332 are illustrated as p-type transistors, n-type transistors may be employed in other embodiments.

In at least some embodiments, the DAC 332 further includes multiple additional transistors 313 selectively connected to a subset of voltage tap points of the string of resistors 303, e.g., a transistor driven by each respective bit of the set of digital bits (D7-D0) modulated out of the SDM 334. Thus, respective transistors of the multiple additional transistors 313 are turned on by the set of digital bits (D7-D0). In these embodiments, the multiple additional transistors 313 are p-type transistors that are coupled between the subset of voltage tap points. While the subset of voltage tap points is located at an end of the string of resistors 303, the subset of voltage tap points may be located elsewhere along the string of resistors 303.

In at least some embodiments, the DAC 332 further includes a fourth transistor (Q4) coupled between a supply voltage (Vdd) and the ring oscillator 338. Outputs of the multiple additional transistors 313 are coupled to a gate of the fourth transistor (Q4) and are configured to cause the fourth transistor (Q4) to generate the second current that is also provided to the ring oscillator 338, e.g., in combination with the first current from the main DAC path through the third transistor (Q3). While the DAC 332 is illustrated as providing a digital-to-analog conversion path for both the filtered MSB bits and the filtered LSB bits, in other embodiments, the DAC 332 is separated into two DACs (e.g., the DACs 232 and 236 of FIG. 2), each providing a respective digital-to-analog conversion separately for the filtered MSB bits and the filtered LSB bits.

In these embodiments, the DAC 332 can further include a capacitor (C1) coupled between the gate of the fourth transistor (Q4) and the supply voltage (Vdd). The capacitor (C1) can be employed to integrate (e.g., accumulate) and hold the charge from the multiple additional transistors 313 flowing from the subset of voltage tap points of the string of resistors 303. Also, as mentioned, the modulation of the SDM 334 occurs at a higher frequency than that of operating the DAC 332, and thus the capacitor (C1) can ensure the proper charge is stored to trigger supply of the right amount of the second current via the fourth transistor (Q4) despite the higher frequency.

In the various disclosed embodiments, because the SDM 334 modulates the set of digital bits (D7-D0) at a higher frequency than operation of the TDC 210, DLF 220, and the DAC 332, the combination of current provided to the ring oscillator 338 includes better resolution and less jitter than the DPLL 100, e.g., by averaging the current level to correspond to a target steady state frequency that is between two of the multi-bit codes generated by the TDC 210. This improvement in jitter may include the removal of sidebands in the output signal of the DCO circuit 230 or 330 that were caused by the low frequency code updates of the DCO 130 (FIG. 1).

Figure 4:
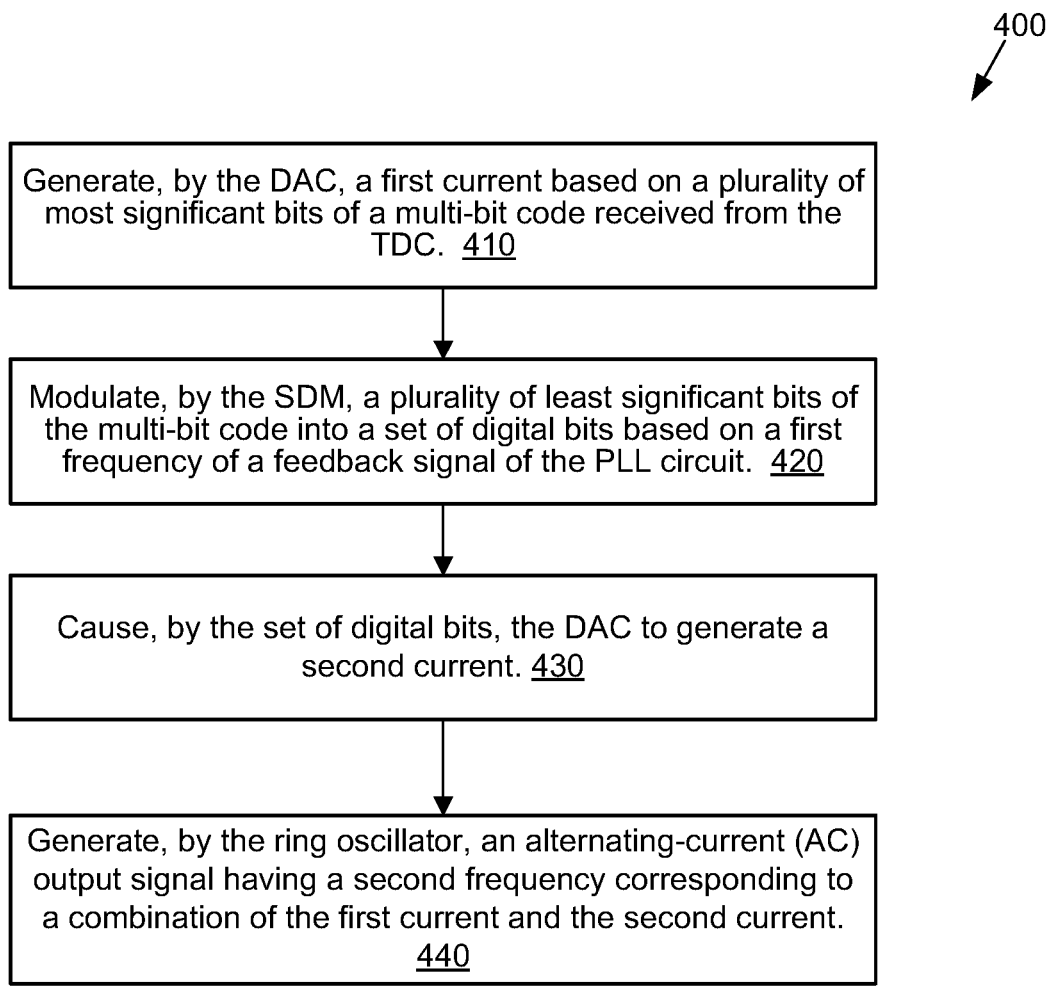
FIG. 4 is a flow diagram of a method of operating a digital PLL (DPLL) according to at least one embodiment.

FIG. 4 is a flow diagram of a method 400 of operating a digital PLL (DPLL) according to at least one embodiment. In these embodiments, the method 400 is performed by the DCO circuit 230 of FIG. 2 or the DCO circuit 330 of FIG. 3 of the disclosed DPLLs. The operations need not be performed in a specific order, unless explicitly disclosed to be required to be performed in such an order.

At operation 410, the method 400 includes generating, by a DAC, a first current based on the most significant bits (MSB) of a multi-bit code received from the TDC 210, e.g., and that has been digitally filtered by the DLF 220. The DAC can be the DAC 332 of FIG. 3 or the DAC 232 of FIG. 2. This operation 410 may further include employing the various components discussed within the DAC 332 illustrated and discussed with reference to FIG. 3.

At operation 420, the method 400 further includes modulating, by the SDM 234 or 334, the least significant bits (LSB) of the multi-bit code into a set of digital bits (e.g., D7-D0) based on a first frequency of a feedback clock of a digital phase-locked loop (DPLL) circuit such as the DPLL 200. This modulating, however, is at a higher frequency than that of the DAC in operation 410, for example.

At operation 420, the method 400 further includes causing, by the set of digital bits, the DAC to generate a second current. As discussed, operation 420 can be employed with a separate DAC to the one employed in operation 410, e.g., the DAC 236 of FIG. 2.

At operation 430, the method further includes generating, by the ring oscillator 238 or 338, an alternating-current (AC) output signal having a second frequency (e.g., Fout) corresponding to a combination of the first current and the second current.

Various embodiments of the AC-DC flyback converter described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A digitally-controlled oscillator (DCO) circuit comprising:
   a digital-to-analog converter (DAC) to generate a first current based on a plurality of most significant bits of a multi-bit code received from a time-to-digital converter (TDC) of a digital phase-locked loop (DPLL);
   a sigma-delta modulator (SDM) to modulate a plurality of least significant bits of the multi-bit code into a set of digital bits based on a first frequency of a feedback clock of the DPLL, wherein the set of digital bits is to cause the DAC to generate a second current, and wherein modulation of the SDM occurs at a higher frequency than that of operating the DAC; and
   a ring oscillator coupled to the DAC, the ring oscillator to generate an alternating-current (AC) output signal having a second frequency corresponding to a combination of the first current and the second current.

2. The DCO circuit of claim 1, wherein the TDC is to generate the multi-bit code that quantifies a phase error between an input reference clock and the feedback clock of the DPLL.

3. The DCO circuit of claim 1, wherein the first frequency is the second frequency divided by an integer value within a frequency divider in a feedback loop of the DPLL.

4. The DCO circuit of claim 1, wherein the DAC comprises:
   a string of resistors that are selectable according to the plurality of most significant bits of the multi-bit code:
   a plurality of first transistors selectively connected to a subset of voltage tap points of the string of resistors, wherein respective transistors of the plurality of first transistors to be turned on by the set of digital bits; and
   a second transistor coupled between a supply voltage and the ring oscillator, wherein outputs of the plurality of first transistors are coupled to a gate of the second transistor and are to cause the second transistor to generate the second current.

5. The DCO circuit of claim 4, wherein the DAC further comprises a capacitor coupled between the gate of the second transistor and the supply voltage.

6. The DCO circuit of claim 5, wherein the string of resistors are selectively coupled to a gate of a third transistor that is coupled between the supply voltage and the ring oscillator, and wherein, to generate the first current, the plurality of most significant bits are to cause a tapped selection of a subset of resistors of the string of resistors.

7. The DCO circuit of claim 1, wherein the SDM is implemented, in part, with a register-transfer level (RTL) digital logic and hardware.

8. A digital phase-locked loop (DPLL) circuit comprising:
   a time-to-digital converter (TDC) to generate a multi-bit code based on a phase error between an input reference clock and a feedback clock of the DPLL circuit;
   a digital loop filter (DLF) coupled to the TDC, the DLF to digitally filter the multi-bit code;
   a digitally-controlled oscillator (DCO) circuit coupled to the DLF and to generate an output signal that is convertible to the feedback clock, wherein the DCO circuit comprises:
      a digital-to-analog converter (DAC) to generate a first current based on a plurality of most significant bits of the filtered multi-bit code;
      a sigma-delta modulator (SDM) to modulate a plurality of least significant bits of the filtered multi-bit code into a set of digital bits based on a first frequency of the feedback clock, wherein the set of digital bits is to cause the DAC to generate a second current, and wherein modulation of the SDM occurs at a higher frequency than that of operating the DAC; and
      a ring oscillator coupled to the DAC, the ring oscillator to generate an alternating-current (AC) output signal having a second frequency corresponding to a combination of the first current and the second current.

9. The DPLL circuit of claim 8, wherein the TDC is to generate the multi-bit code that quantifies a phase error between an input reference clock and the feedback clock of the DPLL.

10. The DPLL circuit of claim 8, further comprising a frequency divider coupled between the DCO circuit and the TDC, the frequency divider to divide the second frequency of the AC output signal down to the first frequency.

11. The DPLL circuit of claim 8, wherein the DLF is further to:

digitally filter the multi-bit code via proportional path logic having a first gain and integral path logic having a second gain; and separate the most significant bits from the least significant bits for input into the DCO circuit.

12. The DPLL circuit of claim 9, wherein the DAC comprises:
   a string of resistors that are selectable according to the plurality of most significant bits of the filtered multi-bit code:
   a plurality of first transistors selectively connected to a subset of voltage tap points of the string of resistors, wherein respective transistors of the plurality of first transistors to be turned on by the set of digital bits; and
   a second transistor coupled between a supply voltage and the ring oscillator, wherein outputs of the plurality of first transistors are coupled to a gate of the second transistor and are to cause the second transistor to generate the second current.

13. The DPLL circuit of claim 12, wherein the DAC further comprises a capacitor coupled between the gate of the second transistor and the supply voltage.

14. The DPLL circuit of claim 12, wherein the string of resistors are selectively coupled to a gate of a third transistor that is coupled between the supply voltage and the ring oscillator, and wherein, to generate the first current, the plurality of most significant bits are to cause a tapped selection of a subset of resistors of the string of resistors.

15. The DPLL circuit of claim 9, wherein modulation of the SDM occurs at a higher frequency than that of operating the DAC and is implemented, in part, with a register-transfer level (RTL) digital logic and hardware.

16. A method of operating a digital phase-locked loop (DPLL) circuit comprising a time-to-digital converter (TDC) and a digitally-controlled oscillator (DCO) circuit, the DCO circuit comprising a digital-to-analog converter (DAC) coupled to the TDC, a sigma-delta modulator (SDM) coupled to the TDC, and a ring oscillator coupled to the DAC, the method of operating the DPLL circuit comprising:
   generating, by the DAC, a first current based on a plurality of most significant bits of a multi-bit code received from the TDC;
   modulating, by the SDM, a plurality of least significant bits of the multi-bit code into a set of digital bits based on a first frequency of a feedback clock of the DPLL circuit, wherein modulating, by the SDM, is performed at a higher frequency than that of operating the DAC;
   causing, by the set of digital bits, the DAC to generate a second current; and
   generating, by the ring oscillator, an alternating-current (AC) output signal having a second frequency corresponding to a combination of the first current and the second current.

17. The method of claim 16, wherein the DPLL circuit further comprises a digital loop filter (DLF), the method further comprising:
   generating, by the TDC, the multi-bit code based on a phase error between an input reference clock and the feedback clock; and
   digitally filtering, by the DLF, the multi-bit code to generate a filtered multi-bit code that is provided to the DCO circuit.

18. The method of claim 16, wherein the DPLL circuit further comprises a frequency divider, the method further comprising dividing, by the frequency divider, the second frequency by an integer value down to the first frequency.

19. The method of claim 16, further comprising:
   employing, within the DAC, a string of resistors that are selectable according to the plurality of most significant bits of the multi-bit code;
   employing, within the DAC, a plurality of first transistors selectively connected to a subset of voltage tap points of the string of resistors;
   selectively turning on, by the DAC, respective transistors of the plurality of first transistors according to the set of digital bits; and
   employing, within the DAC, a second transistor coupled between a supply voltage and the ring oscillator, wherein outputs of the plurality of first transistors are coupled to a gate of the second transistor, causing the second transistor to generate the second current.

* * * * *